United States Patent
Fletcher

(10) Patent No.: US 8,278,909 B2
(45) Date of Patent: Oct. 2, 2012

(54) WIDE-DYNAMIC RANGE ELECTROMETER WITH A FAST RESPONSE

(75) Inventor: William Roger Fletcher, Whitchurch (GB)

(73) Assignee: MKS Instruments, Inc., Andover, MA (US)

( * ) Notice: Subject to any disclaimer, the term of this patent is extended or adjusted under 35 U.S.C. 154(b) by 386 days.

(21) Appl. No.: 12/504,652

(22) Filed: Jul. 16, 2009

(65) Prior Publication Data
US 2011/0012588 A1    Jan. 20, 2011

(51) Int. Cl.
G01R 1/30 (2006.01)
G01R 17/00 (2006.01)

(52) U.S. Cl. .................. 324/123 R; 324/123 C; 324/124

(58) Field of Classification Search .................. 324/73.1, 324/123 R, 123 C, 124, 457–458
See application file for complete search history.

(56) References Cited

U.S. PATENT DOCUMENTS

| | | | | |
|---|---|---|---|---|
| 4,050,019 A * | 9/1977 | Nirschl | | 324/115 |
| 4,103,231 A | 7/1978 | Nemcek, Sr. | | 324/123 |
| RE30,087 E * | 8/1979 | White et al. | | 377/60 |
| 4,198,607 A | 4/1980 | Beinitz et al. | | |
| 4,330,749 A | 5/1982 | Eda et al. | | 324/457 |
| 4,370,615 A * | 1/1983 | Whistler et al. | | 324/457 |
| 5,153,502 A * | 10/1992 | Morgan et al. | | 324/123 R |
| 5,572,118 A | 11/1996 | Lewis | | 324/123 |
| 5,770,956 A * | 6/1998 | Rolff | | 327/103 |
| 6,008,653 A * | 12/1999 | Popovic et al. | | 324/456 |
| 6,414,318 B1 | 7/2002 | Uber, III et al. | | 250/389 |
| 6,570,385 B1 * | 5/2003 | Roberts et al. | | 324/378 |
| 7,230,431 B2 * | 6/2007 | Mirme | | 324/458 |
| 8,143,880 B2 * | 3/2012 | Vulovic et al. | | 324/115 |
| 8,174,254 B2 * | 5/2012 | Reichel et al. | | 324/123 C |
| 2008/0056732 A1 | 3/2008 | Nishimura et al. | | |
| 2008/0100300 A1 * | 5/2008 | Williams | | 324/458 |

FOREIGN PATENT DOCUMENTS

| | | |
|---|---|---|
| DE | 195 02 402 A1 | 9/1999 |
| GB | 2 336 217 A | 10/1999 |
| WO | 2009/000236 A2 | 12/2008 |

OTHER PUBLICATIONS

"Embeddable Tool and Process Remote Sensing," Ds-7000-02-Ver. 1, by MKS Ion Systems, © 2007 MKS Instruments, Inc., (2 pages).
"The Remote Voltage Sensor (RVS) Theory of Operation Technical Note," by MKS Ion Systems, © 2008 MKS Instruments, Inc., (2 pages).
Sen-Yen Shaw, "An Integrated-Circuit Based Wide Range Electrometer Implemented with Automatically Ranged Linear Display," Review of Scientific Instruments, vol. 63 No. 6, Jun. 1, 1992, pp. 3505-3507.

* cited by examiner

*Primary Examiner* — Joshua Benitez Rosario
(74) *Attorney, Agent, or Firm* — Proskauer Rose LLP

(57) ABSTRACT

A method and apparatus for measuring current includes sensing a first voltage at the output of an amplifier and computing a current based on the first voltage and the resistance of a first resistive element, which is electrically coupled between an inverting input of the amplifier and the output of the amplifier, if the first voltage is below a predetermined level. The method also includes sensing a second voltage at the output of a buffer and computing a current based on the first and second voltages and the resistances of the first resistive element and a second resistive element, which is electrically coupled between the inverting input of the amplifier and an input of the buffer and is also electrically coupled to the output of the amplifier through a at least one diode, if the voltage output from the amplifier is above the predetermined level.

12 Claims, 10 Drawing Sheets

WIDE-DYNAMIC RANGE ELECTROMETER WITH A FAST RESPONSE

TECHNICAL FIELD

This invention relates generally to methods and systems for measuring electrical currents. In particular, the invention relates to methods and systems for quickly measuring electrical currents with a wide-dynamic range.

BACKGROUND

Electrometers measure a wide range of currents at extremely low levels. For example, mass spectrometers use current sensors having eight decades of coverage ranging from less than 0.1 picoamps (pA) to 10.0 femtoamps (fA). The most straightforward way to measure current is to use an operational amplifier in the feedback configuration. FIG. 1 illustrates a feedback configuration in which resistor R (101) is the feedback element. The operational amplifier 30 includes an inverting input 32A, a non-inverting input 32B, and an output 34. Resistor R is electrically coupled between the output 34 of the amplifier 30 and the inverting input 32A of the amplifier 30 to form a feedback loop. The non-inverting input 32B is grounded. In this configuration, the output voltage Vout is related to the input current Iin according to the following relationship:

Vout=IinR.

Such a configuration, however, suffers from a number of problems. For a given bandwidth and temperature, the input current noise is inversely proportional to the square root of the resistance of resistor R. Therefore, as the resistance of resistor R decreases, the input current noise increases (similarly, as the resistance of resistor R increases, the input current noise decreases).

The input current noise is also proportional to the square root of the bandwidth and the absolute temperature. The bandwidth, which determines the response time, is dominated by the time constant formed from the value of the feedback resistor R and its inherent capacitance as well as any stray capacitance. To improve the response time, the time constant can be reduced by choosing a resistor R with a small resistance value. But this has the effect of increasing the noise partly because of the increased bandwidth and partly because of a smaller resistance.

Integration can be used to reduce the noise. The noise is inversely proportional to the square root of the integration time. Therefore, as the integration time increases, the noise decreases. But integration effectively reduces the bandwidth and increases the response time of the electrometer. The relationship between integration time and bandwidth is $$Bw = \frac{1}{\pi \cdot T} \text{ Hz}.$$

Thus, a one-second integration time is equivalent to a bandwidth of 0.318 Hz. And as the integration time increases, bandwidth decreases thereby increasing the response time.

An electrometer that utilizes an operational amplifier with a single feedback resistor R also suffers from a limited dynamic range. The dynamic range is determined by the ratio of the largest signal which can be measured to twice the RMS noise level, which may represent the smallest signal that can be adequately detected. For a full-scale signal of 10 Volts, the full-scale current will be $$\frac{10}{R} \text{ Amps}.$$

The voltage noise across the resistor R is given by $\sqrt{4 \cdot K \cdot T \cdot R \cdot Bw}$ Volts RMS, where $K=1.38 \times 10^{-23}$ (Boltzman's constant), T=absolute temperature in ° K, R=resistance in Ohms, and Bw=Bandwidth in Hertz (assuming a brick-wall filter). Therefore the equivalent current noise will be $$\frac{\sqrt{4 \cdot K \cdot T \cdot R \cdot Bw}}{R} \text{ Amps RMS}.$$

If the minimum detectable signal is twice the noise then the dynamic range will be $$\frac{5}{\sqrt{4 \cdot K \cdot T \cdot R \cdot Bw}} : 1.$$

Table 1 below lists the dynamic ranges obtainable from various resistors and bandwidths at an absolute temperature of 300° K:

TABLE 1

| Resistor values in ohms | Bandwidth | | | |
| --- | --- | --- | --- | --- |
| | 1 Hz | 10 Hz | 100 Hz | 1 KHz |
| 50 M | $5.49 \times 10^6$ | $1.74 \times 10^6$ | $5.49 \times 10^5$ | $1.74 \times 10^5$ |
| 100 M | $3.89 \times 10^6$ | $1.25 \times 10^6$ | $3.89 \times 10^5$ | $1.23 \times 10^5$ |
| 1 G | $1.23 \times 10^6$ | $3.89 \times 10^5$ | $1.23 \times 10^5$ | $3.89 \times 10^4$ |
| 10 G | $3.89 \times 10^5$ | $1.23 \times 10^5$ | $3.89 \times 10^4$ | $1.23 \times 10^4$ |
| 100 G | $1.23 \times 10^5$ | $3.89 \times 10^4$ | $1.23 \times 10^4$ | $3.89 \times 10^3$ |

As shown in Table 1, the best dynamic range is achieved with resistors having lower resistances. In some applications the maximum available signal current is around 200 nA, which for a 10 Volt signal represents a resistor of 50 megaohms. However, a feedback resistor R with a resistance value lower than 50 megaohms cannot be used to obtain a better dynamic range because the full-scale output would not be possible. Indeed, if a large input current were applied to a feedback resistor R with a resistance value lower than 50 megaohms, the voltage output Vout would saturate (i.e., Vout will be equal to the source voltage levels applied to the operational amplifier 30).

One way to increase the dynamic range is to add a resistor bank including resistors Ra, Rb, and Rc (102*a-c*) and switches or relays Sa, Sb, and Sc (103*a-c*) (as shown in FIG. 1) that provide selectable resistance levels. Such a resistor bank, however, has several disadvantages. First, switches with minimal leakage current are sophisticated and therefore expensive. Second, switches with relays induce electrostatic fields and introduce other disturbances that interfere with the input current signal. Third, the use of switches results in lengthy settling times when switching between resistors. Finally, switches suffer from overload recovery time problems if a large over-scale input signal is applied to a resistor with a high-resistance value.

SUMMARY

The invention generally features a system and method for measuring currents. One advantage of the invention is that it provides faster current measurements over a wide dynamic range from hundreds of nanoamps down to femtoamps. Another advantage of the invention is that it eliminates saturation or overload problems, which give bad data and result in overload recovery time problems.

The invention, in one aspect, features an electrometer. The electrometer includes an amplifier, resistive elements, a buffer with a high-impedance input, and at least one diode. The amplifier has an inverting input, a non-inverting input, and an output. The resistive elements include a first resistive element and a second resistive element. Each resistive element has a first end and a second end. The first ends of the resistive elements are electrically coupled to the inverting input of the amplifier. The second end of the first resistive element is electrically coupled to the output of the amplifier. The buffer has an input and an output. The second end of the second resistive element is electrically coupled to the input of the buffer. The at least one diode is electrically coupled between the output of the amplifier and the second end of the second resistive element.

In some embodiments, the buffer is a second amplifier that has an inverting input, a non-inverting input, and an output. The output of the second amplifier is electrically coupled to the inverting input of the second amplifier. In this configuration, the non-inverting input of the second amplifier is the input of the buffer and the output of the second amplifier is the output of the buffer.

In some embodiments, the electrometer also includes a computational unit electrically coupled to the outputs of the amplifier and the buffer. The computational unit computes a current level based on the resistance values of the first and second resistive elements and the voltage levels at the outputs of the amplifier and the buffer.

In some embodiments, the resistance of the first resistive element is greater than the resistance of the second resistive element. The resistance of the second resistive element can be between 10 megaohms and 100 megaohms and the resistance of the second resistive element can be between 5 gigaohms and 50 gigaohms. In some embodiments, the ratio between the resistance values of the resistive elements is greater than 10.

In some embodiments, the plurality of diodes include a first diode and a low-leakage and low-capacitance second diode, each of which have a first end and a second end. The first end of the second diode is electrically coupled to the input of the buffer and the second end of the second diode is electrically coupled to the first diode. In some embodiments, the first diode is a small signal silicon diode. In some embodiments, the electrometer also includes a third resistive element electrically coupling the second end of the second diode to ground.

In some embodiments, the electrometer also includes a capacitor and an adjustable gain amplifier that has an input and an output. The input of the adjustable gain amplifier can be electrically coupled to the second end of the second diode. The output of the adjustable gain amplifier can be electrically coupled to the first end of the second diode through the capacitor. The adjustable gain amplifier is configured to discharge the capacitor with a charge opposite the charge in the second diode.

In some embodiments, the electrometer also includes a temperature controller that is coupled to at least the second diode, the amplifier, and the high-impedance buffer. In some embodiments, the plurality of diodes includes pairs of diodes, where the diodes in each pair are electrically coupled in parallel and arranged with reverse polarity. In some embodiments, the electrometer also includes a first anti-alias filter and a second anti-alias filter. The first anti-alias filter is electrically coupled to the output of the amplifier and the second anti-alias filter is electrically coupled to the output of the buffer. The electrometer also includes a first analog-to-digital (A/D) converter and a second A/D converter. The first A/D converter is electrically coupled to the output of the first anti-alias filter and the second A/D converter is electrically coupled to the output of the second anti-alias filter.

The invention, in another aspect, features a method for measuring current. The method includes sensing a first voltage at an output of an amplifier and computing a current based on the first voltage and the resistance of a first resistive element, which is electrically coupled between an inverting input of the amplifier and an output of the amplifier, if the first voltage is below a predetermined level. The method also includes sensing a second voltage at an output of a buffer and computing a current based on the first and second voltages and the resistances of the first resistive element and a second resistive element, which is electrically coupled between the inverting input of the amplifier and an input of the buffer, if the voltage output from the amplifier is above the predetermined level.

In some embodiments, the method further includes sampling the change in the forward voltage of at least one of a plurality of diodes electrically coupled between the input of the buffer and the output of the amplifier, and injecting a first charge into the at least one of the plurality of diodes. The first charge is opposite to a second charge associated with the at least one of the plurality of diodes. In some embodiments, the method also includes adjusting the level of the first charge to match the second charge associated with the at least one of the plurality of diodes.

In some embodiments, sensing the voltages includes reading first voltage data output from a first A/D converter, which is electrically coupled to the output of the amplifier, and reading second voltage data output from a second A/D converter, which is electrically coupled to the output of the buffer.

In some embodiments, the method also includes applying a zero-input signal to the inverting input of the amplifier and reading first voltage data from the first A/D converter to obtain zero-input voltage data. In these embodiments, computing a current based on the resistance of the first resistive element includes computing the difference between the first voltage data and the zero-input voltage data and dividing the result by the resistance of the first resistive element to obtain first current data. In some embodiments, the method also includes reading second voltage data from the second A/D converter to obtain second zero-input voltage data. In these embodiments, computing a current based on the resistances of the first resistive element and the second resistive element includes computing the difference between the second voltage data and the second zero-input voltage data and dividing the result by the resistance of the second resistive element to obtain second current data, and summing the first current data and the second current data.

BRIEF DESCRIPTION OF THE DRAWINGS

The foregoing and other objects, feature and advantages of the invention, as well as the invention itself, will be more fully understood from the following illustrative description, when read together with the accompanying drawings which are not necessarily to scale.

DETAILED DESCRIPTION

Figure 1:
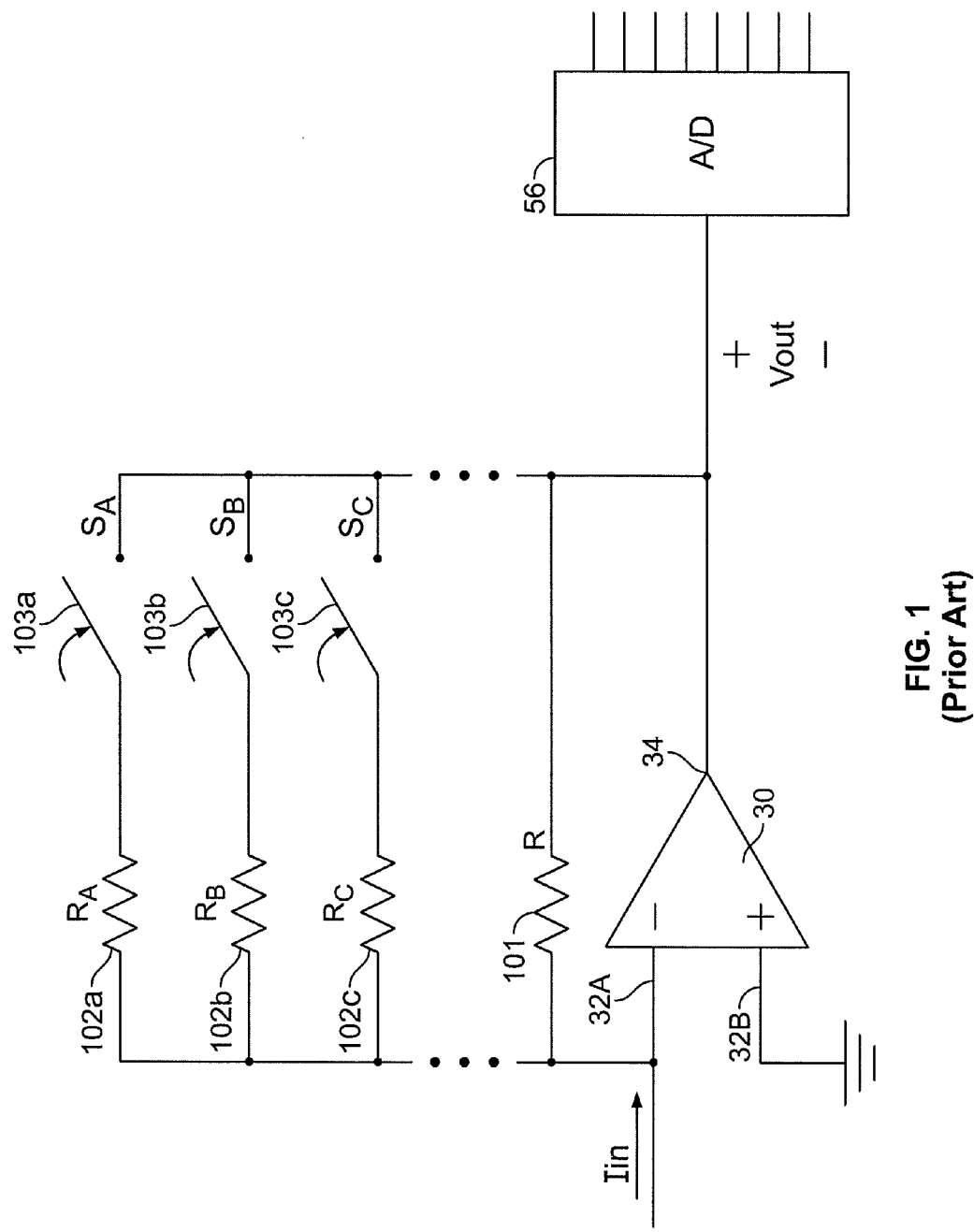
FIG. 1 is a schematic diagram of an electrometer according to the prior art.
Figure 2A:
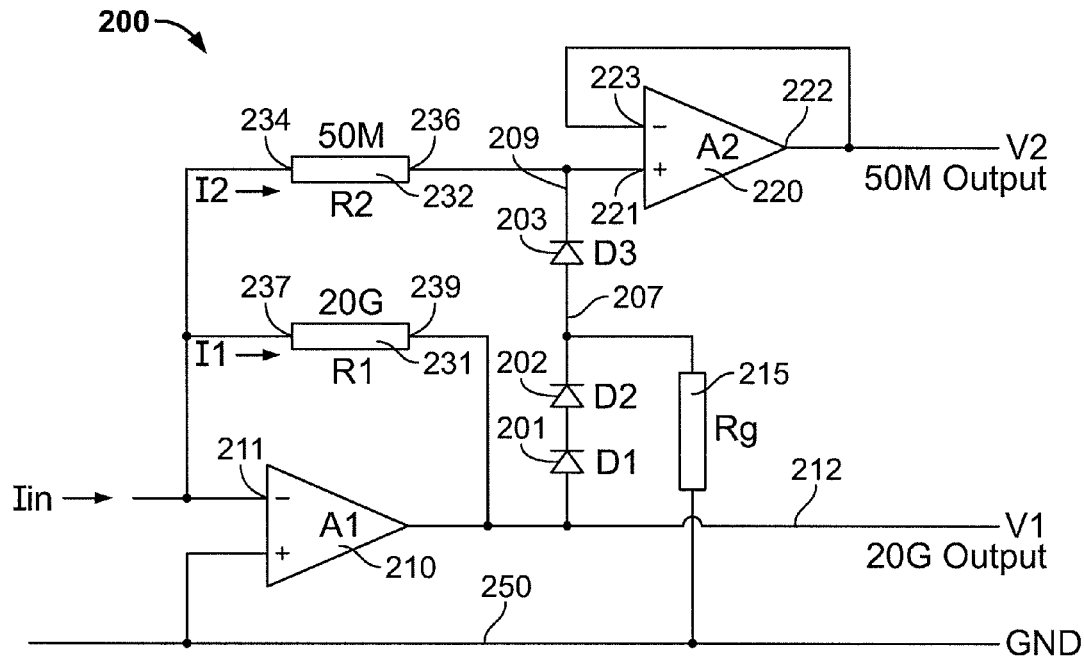
FIGS. 2A-2C are schematic diagrams of electrometers according to illustrative embodiments of the invention.

FIG. 2A is a schematic diagram of an electrometer 200 according to an illustrative embodiment of the invention. The electrometer 200 includes two high input impedance electrometer amplifiers A1 and A2 (210, 220), such as AD549 operational amplifiers. The electrometer 200 also includes resistors R1 and R2 (231, 232). In this embodiment, resistor R1 has a resistance of 20 gigaohms and resistor R2 has a lower resistance of 50 megaohms. The first end 237 of resistor R1 is electrically connected to the inverting input 211 of amplifier A1 (210) and the second end 239 of resistor R1 is electrically connected to the output 212 of amplifier A1. This configuration of amplifier A1 and resistor R1 forms a current-to-voltage converter.

The electrometer 200 also includes three diodes connected in series D1, D2, D3 (201-203). In some embodiments, diodes D1 (201) and D2 (202) are small signal silicon diodes (e.g., the 1N4148-type diodes), and diode D3 (203) is a very low-leakage and low-capacitance diode (e.g., the FJH1100-type diode). The first end 234 of resistor R2 is electrically connected to the inverting input 211 of amplifier A1 and the second end 236 of resistor R2 is electrically connected to the output of amplifier A1 through the three diodes connected in series 201-203. The second end 236 of resistor R2 is also connected to the non-inverting input 221 of amplifier A2 (220), which has been configured as a buffer amplifier with a high-impedance input by electrically connecting the output 222 of amplifier A2 to the inverting input 223 of amplifier A2. The voltage at the output of amplifier A2 represents the voltage on the cathode 209 of diode D3. The amplifier 220 configured as a buffer with a high-impedance input prevents any other circuit electrically coupled to the second end of the resistor R2 from loading the electrometer and interfering with its operation.

When an increasing current signal Iin is applied to the inverting input 211 of amplifier A1, the voltage at the output of amplifier A1 starts to rise. When diodes D1 and D2 start to conduct, a voltage signal appears on the anode 207 of diode D3. As the current signal further increases, diode D3 starts to conduct and a current I2 flows through resistor R2. After diode D3 starts to conduct, and assuming that the input currents and offset voltages of the amplifiers A1 and A2 are negligible, the input current Iin applied to the inverting input 211 of amplifier A1 is equal to the sum of the current I1 through resistor R1 and the current I2 through resistor R2. The current I1 is equal to the output voltage V1 divided by the value of resistor R1 and the current I2 is equal the voltage on the cathode 209 of diode D3 divided by the resistance value of resistor R2. Thus, the current Iin is given by the following equation:

$$Iin = I1 + I2 = \frac{V1}{R1} + \frac{V2}{R2}.$$

Current I2 can flow through resistor R2 only if the output voltage V1 is greater than the sum of the forward voltages (Vf) of the three diodes connected in series (D1, D2 and D3). As a result, at very low currents the output voltage V2 is made up entirely of the noise from resistor R2 and the output voltage V1 represents the total input current.

At higher input currents, where the output voltage V1 is greater than the forward voltage of the diodes D1, D2, and D3, current I2 will flow through resistor R2 and the input current Iin is represented by both output voltages V1 and V2. Output voltages V1 and V2 may be connected to individual A/D converters so that their data outputs can be read by digital logic circuitry or a software program running on a computer processor.

The full-scale current is largely determined by resistor R2, but if the software program only records output voltage V1 and ignores output voltage V2 when output voltage V1 is less than Vf of the diodes, then the noise is determined by R1 and the noise from R2 is irrelevant. This virtue gives the electrometer circuit a wider than normal dynamic range since R2 determines the full-scale range and R1 determines the noise floor. Thus, the invention combines the benefits of the full-scale range from a lower value resistor R2 with the benefits of lower noise from the higher value resistor R1.

As long as the diodes D1, D2, and D3 are conducting, R1 and R2 are effectively in parallel so that the response is determined by this parallel combination and any stray capacitance. This parallel combination is dominated by the relatively low resistance of R2 which makes the time constant small and the response therefore fast. At very low currents, when the diodes D1, D2, and D3 are not conducting, the response is determined by R1 and its stray capacitance. Thus, embodiments of the invention ensure a fast response over most of the dynamic range.

Figure 2B:
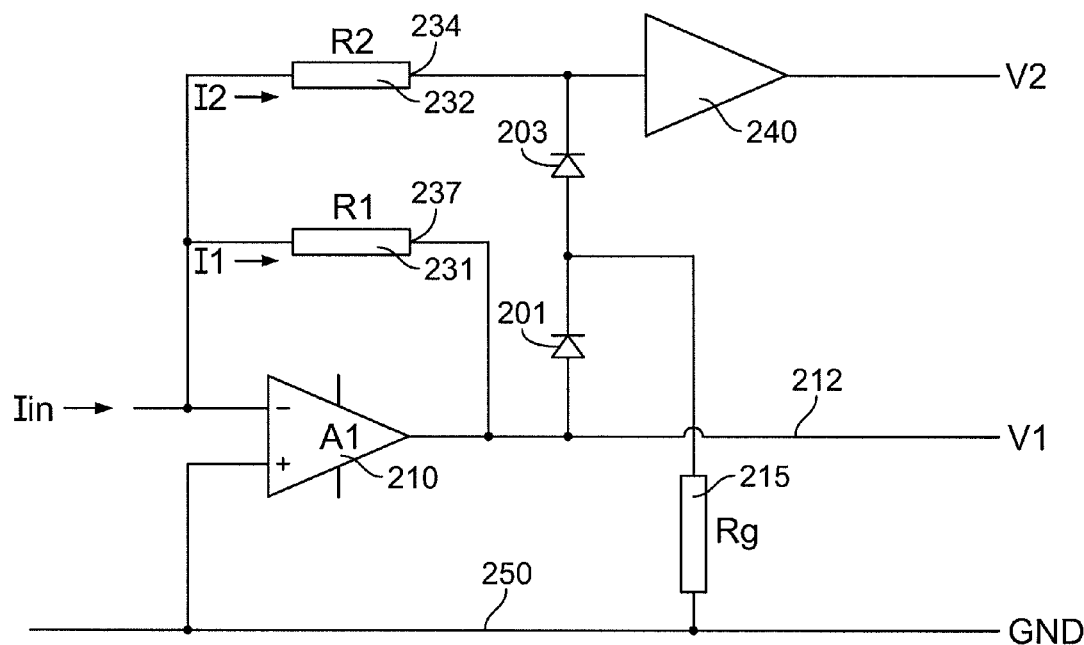

Determining the dynamic range for the electrometers of FIGS. 2A and 2B is straightforward. For the electrometers of FIGS. 2A and 2B, the voltage noise from resistor R1 is given by $$\sqrt{4 \cdot K \cdot T \cdot R1 \cdot Bw} \text{ Volts RMS.}$$

Dividing by the resistance value of resistor R1, the zero signal RMS current noise level is given by $$\frac{\sqrt{4 \cdot K \cdot T \cdot R1 \cdot Bw}}{R1} \text{Amps RMS,}$$

and the minimum detectable signal will be twice that, i.e., $$2\left[\frac{\sqrt{4 \cdot K \cdot T \cdot R_1 \cdot Bw}}{R_1}\right] \text{Amps.}$$

The full-scale output signal level from the electrometer according to embodiments of the invention is determined almost entirely by the 10 Volt output range and the value of resistor R2. Therefore, the maximum output signal is $$\frac{10}{R_2} \text{ Amps.}$$

The dynamic range may be calculated according to the following expression:

$$\frac{\text{Maximum Output Signal}}{\text{Minimun Detectable Signal}} : 1.$$

Therefore, the dynamic range of the electrometers of FIGS. 2A and 2B with a 10 Volt full-scale output is given by the following equation:

$$\frac{\frac{10}{R_2}}{2\left[\frac{\sqrt{4 \cdot K \cdot T \cdot R \cdot Bw}}{R_1}\right]} : 1 = \frac{5 \cdot R1}{R2 \cdot \sqrt{4 \cdot K \cdot T \cdot R1 \cdot Bw}} : 1$$

Table 2 below compares the dynamic ranges for an electrometer using a single resistor and the electrometer of FIGS. 2A and 2B for various bandwidths and equivalent integration times (shown in parenthesis).

TABLE 2

| | Dynamic range for various bandwidths (and equivalent integration times) | | | |
|---|---|---|---|---|
| | 1 Hz (318 ms) | 10 Hz (31.8 ms) | 100 Hz (3.18 ms) | 1 KHz (0.318 ms) |
| Resistor value(s) in ohms | | | | |
| 50 M | $5.49 \times 10^6$ | $1.74 \times 10^6$ | $5.49 \times 10^5$ | $1.74 \times 10^5$ |
| 100 M | $3.89 \times 10^6$ | $1.25 \times 10^6$ | $3.89 \times 10^5$ | $1.23 \times 10^5$ |
| 1 G | $1.23 \times 10^6$ | $3.89 \times 10^5$ | $1.23 \times 10^5$ | $3.89 \times 10^4$ |
| 10 G | $3.89 \times 10^5$ | $1.23 \times 10^5$ | $3.89 \times 10^4$ | $1.23 \times 10^4$ |
| 100 G | $1.23 \times 10^5$ | $3.89 \times 10^4$ | $1.23 \times 10^4$ | $3.89 \times 10^3$ |
| Example embodiments of the invention | | | | |
| 50 M & 20 G | $9.54 \times 10^7$ | $3.02 \times 10^7$ | $9.54 \times 10^6$ | $3.02 \times 10^6$ |
| 5 M & 20 G | $9.54 \times 10^8$ | $3.02 \times 10^8$ | $9.54 \times 10^7$ | $3.02 \times 10^7$ |

As shown in Table 2, example embodiments of the invention achieve at least an order of magnitude greater dynamic range than electrometers using only a single resistor.

In some embodiments, the resistance value of resistor R2 can be between 10 megaohms and 100 megaohms and the resistance value of resistor R1 can be between 5 gigaohms and 50 gigaohms. For example, resistor R2 can have a standard resistance value of 47 megaohms. In some embodiments, the ratio between the resistances of the resistors R1 and R2 is greater than 10. This ratio may depend on the dynamic range and response time required by a particular application. The ratio may also depend on the level of the input current signal and the desired output signal level. For example, if the largest current signal is 2E-7 Amps, then a 50 megaohm resistor is required to obtain a 10 Volt output signal.

When the input current signal decreases to the point where the diodes D1, D2, and D3 stop conducting (i.e., the switch-over point), diode D3 still contains a small amount of charge due to its internal capacitance and the remaining forward voltage Vf. This charge is discharged to ground through resistor Rg.

If resistor Rg was not used, then, when operating at low current levels (when none of the diodes are conducting), the series-connected diodes D1, D2, and D3 and resistor R2 would be in parallel with resistor R1. As a result, the capacitances of the diodes D1, D2, and D3 across resistor R1 would spoil the response from resistor R1. By adding resistor Rg, the capacitance of the diodes D1, D2, and D3 is de-coupled to ground thereby restoring the response from resistor R1. Resistor Rg also ensures that there is a definite low-level signal region over which diode D3 cannot pass any current because resistor Rg shunts the low end Vf leakage from diodes D1 and D2 to ground.

The charge contained in diode D3 that discharges to ground through resistor Rg however, causes a "blip" in current I2, which is an error. This error can be overcome by injecting an equal and opposite charge onto the cathode 209 of diode D3 through a capacitor, which in some embodiments is a very small low-leakage capacitor. In some embodiments, the capacitor is made up of the center pin of a PTFE stand-off and the plated mounting hole for the stand-off. In some embodiments, such a capacitor can amount to about 0.18 pF. To inject an equal and opposite charge onto the cathode 209 of diode D3, an inverting amplifier samples the change in Vf of diode D3 during its commutation and applies the change in Vf of diode D3 via the capacitor to the cathode 209 of diode D3. The inverting amplifier may include an adjustable gain so that the charge removed by the capacitor can be set to match the charge on diode D3. The gain of the inverting amplifier can be adjusted using a potentiometer or other suitable electronic component.

FIG. 2B is a schematic diagram of an electrometer according to another embodiment of the invention. In this embodiment, the diode D2 of the electrometer of FIG. 2A is removed and amplifier A2 is replaced with a buffer 240 with a high-impedance input. As a result, the level of the output voltage V1 at which the current I2 starts to flow through R2 is reduced. In other embodiments, diodes D1 and D2 can be replaced with a string of three or more diodes to increase the output voltage V1 at which the current I2 starts to flow through R2.

Figure 2C:
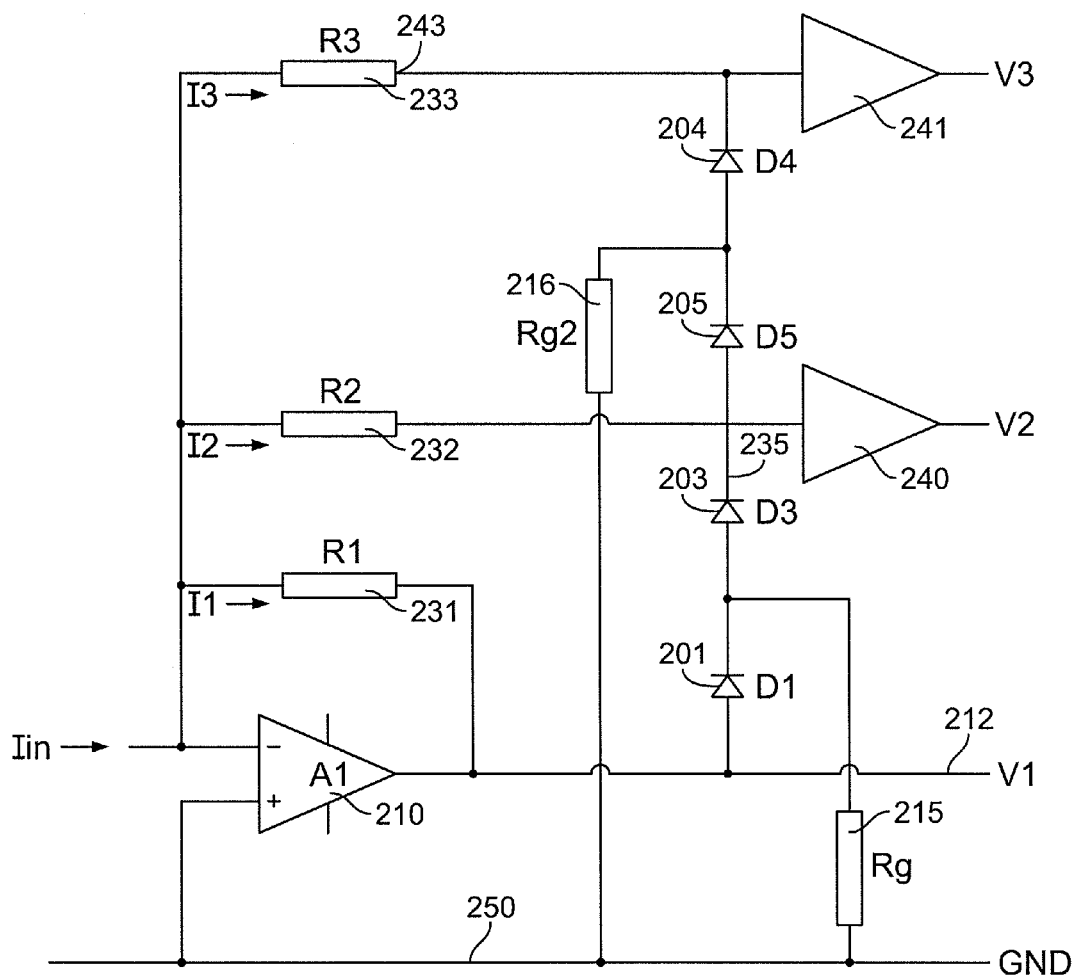

FIG. 2C is a schematic diagram of an electrometer according to another embodiment of the invention. In addition to the components of the electrometer of FIG. 2C, this embodiment further includes resistor R3 (233), diodes D4 (204) and D5 (205) connected in series, a buffer 241, and resistor Rg2 (216). Resistor R3 is electrically coupled between the inverting input of amplifier A1 and the input of buffer 241. Diodes D4 and D5 are electrically coupled between the second end 236 of resistor R3 and the cathode 235 of diode D3. Similar to resistor Rg, resistor Rg2 electrically couples the junction of the cathode of diode D5 and the anode of diode D4 to ground. In this embodiment, when the output voltage V1 is large enough, diodes D4 and D5 conduct, current I3 flows through resistor R3, and a corresponding output voltage V3 appears at the output of buffer 241. When all diodes are conducting, a computational unit can compute a current based on the output voltages V1, V2, and V3 and the resistance values of resistors R1, R2, and R3 (i.e., by computing the currents flowing through resistors R1, R2, R3, and summing the currents). This embodiment provides a larger dynamic range than the embodiments of FIGS. 2A and 2B. Other embodiments may include additional resistors, diodes, and buffers to further increase the dynamic range.

Figure 3:
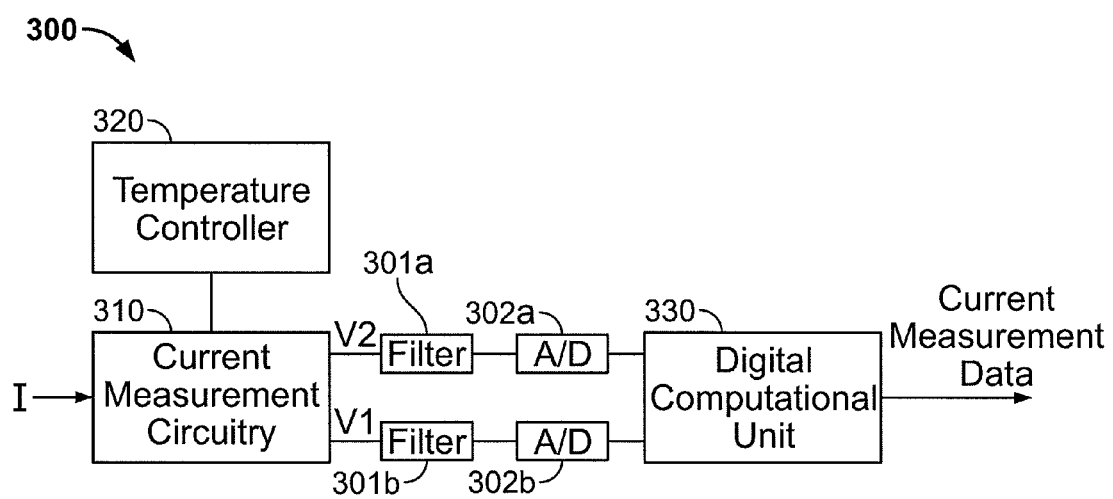
FIG. 3 is a block diagram of a system for measuring current according to an illustrative embodiment of the invention.

FIG. 3 is a block diagram of an electrometer system 300 for measuring current according to an illustrative embodiment of the invention. The system 300 includes a temperature controller 320, current measurement circuitry 310, a pair of anti-alias filters 301a-b, a pair of A/D converters 302a-b, and a digital computational unit 330. The current measurement circuitry 310 may include the analog circuitry for measuring current. This circuitry can include the circuitry shown in FIGS. 2A-2C.

The temperature controller 320 is electrically coupled to heater elements that are located near the critical components of the current measurement circuitry 310. In some embodiments, the temperature controller 320 controls the temperature of the heater elements to stabilize the temperature of the critical components to around 50 degrees Celsius to reduce drift. The critical components may include, but are not limited to, the amplifiers A1 and A2 and the diodes D1, D2, and D3 of the electrometer circuitry shown in FIG. 2A. The heater elements may include resistors that are mounted on the surface of the electrometer's printed circuit board (PCB) in the vicinity of the critical components and their screening box.

Heating the electrometer, however, increases the bias currents to the amplifiers A1 and A2, which in turn increases their noise contribution. This noise can become significant compared to the noise of the resistors R1 and R2. This resistor noise may also increase slightly, but since it is proportional to the square root of the absolute temperature, going from 25 degrees Celsius to 50 degrees Celsius only increases the resistor noise by a small factor, e.g., approximately 4%.

The electrometer system 300 also includes anti-alias filters 301a-b, which filter the voltages output from the current measurement circuitry. The electrometer system 300 also includes A/D converters 302a-b, which are electrically coupled to respective anti-alias filters 301a-b. In some embodiments, the A/D converters may be sampled simultaneously at a rate of 3750 samples per second (sps). This may be achieved by driving both A/D converters 302a-b from the same clock and by using an appropriate command (e.g., the "Synchronization" command for the ADS1256 A/D converter) so that the conversions performed by the A/D converters 302a-b are triggered at the same time.

In some embodiments, the anti-alias filters 301a-b may limit the analog bandwidth to approximately 1.4 KHz, which is comfortably below half the 3750 sps sampling rate of the A/D converters 302a-b. The anti-alias filters 301a-b may also attenuate the voltage output signals V1 and V2 (e.g., by an attenuation factor of 0.25) to make them compatible with the A/D converters 302a-b (e.g., an ADS1256 A/D converter). Because of the wide dynamic range required from the analog voltage output signals V1 and V2, the anti-alias filters 301a-b may be connected differentially to the A/D converters 302a-b to minimize common mode noise.

In some embodiments, the A/D converters 302a-b are disposed on a PCB assembly that is separate from the PCB assembly of the current measurement circuitry 310. In some embodiments, the layout of the circuitry surrounding the A/D converters 302a-b is designed to reduce the noise in the A/D converters 302a-b. A low-noise reference voltage may also be provided to the A/D converters 302a-b to reduce the noise.

The electrometer system 300 also includes a digital computational unit 330, which performs computations on the digital voltage data output from the A/D converters 302a-b to obtain current measurement data. Because the electrometer current signals may inherently have a zero offset associated with them, the digital computational unit 330 may apply a zero correction based on readings from the A/D converters taken with no input signal.

In deciding whether to reject noise from resistor R2 on small signals (when current is not flowing through resistor R2), the digital computational unit 330 reads the raw digital voltage data from A/D converter 302b associated with resistor R1 (i.e., the digital voltage data corresponding to output voltage V1). If the absolute value of the voltage data is less than 10000 H (hexadecimal) (or 156 mV at the input to the anti-alias filter 301b or 39 mV at the input to the A/D converter 302b (because of the 0.25 attenuation factor of the anti-alias filter)), then the output voltage V2 (associated with the smaller resistor R2) is ignored. In some embodiments, the digital computational unit 330 multiplies all data by a factor to compensate for an attenuation factor in the anti-alias filters 301a, 301b (e.g., multiply by a factor of four to compensate for a 0.25 attenuation factor), which may be needed to adapt the full-scale range of the A/D converters 302a-b.

The digital computational unit 330 may include a processor that executes the following software instructions for computing the current based on the digital voltage data output from the A/D converters:

IF $ABS(V20G) > 10000\ H$,

THEN $I = [\{(V20G - V20GZ)/20E+9\} + \{(V50M - V50MZ)/47E+6\}]*4$,

ELSE $I = [(V20G - V20GZ)/20E+9]*4$, where V20G is the voltage read from the analog-to-voltage converter 302b associated with the larger resistor R1, V20GZ is the voltage read from the analog-to-voltage converter 302b associated with the larger resistor R1 with zero signal input, V50G is the voltage read from the analog-to-voltage converter 302a associated with the smaller resistor R2, V50GZ is the voltage read from the analog-to-voltage converter 302a associated with the smaller resistor R2 with a zero input signal, and "ABS( )" is a function that determines the magnitude of a given input to the function.

Figure 4:
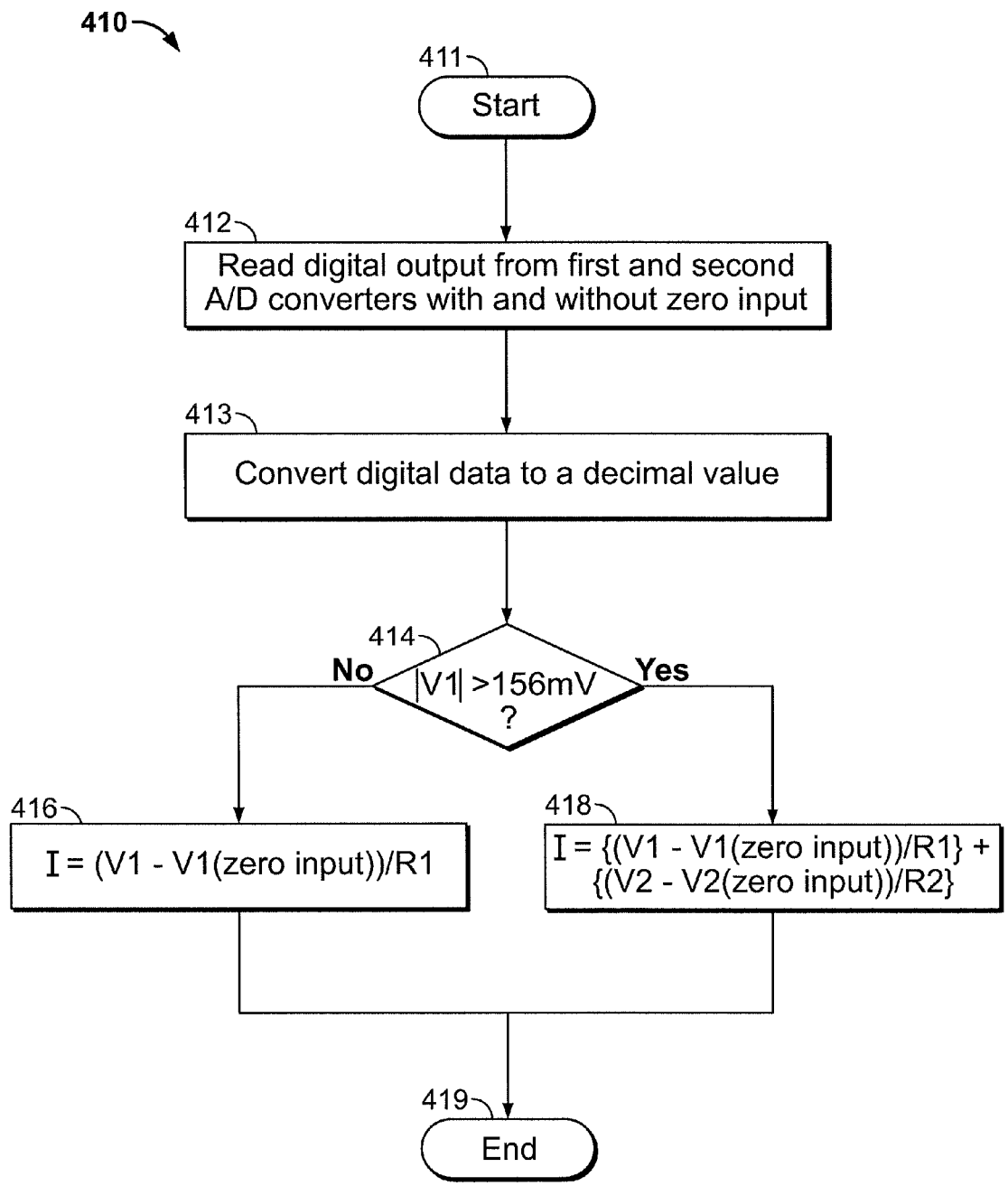
FIG. 4 is a flowchart of a process for computing a current value based on the voltage data output from the A/D converters of the system of FIG. 3, according to an illustrative embodiment of the invention.

In other embodiments, the digital computational unit 330 may convert the raw digital voltage data to a decimal number and use that number to determine whether the voltage V1 is greater than 156 mV or other predetermined voltage value. For example, FIG. 4 is a flowchart of a process 410, which may be implemented as digital circuitry in the digital computational unit 330, for computing a current value based on voltage data output from the A/D converters of the system of FIG. 3. After starting 401, digital data with and without zero input is read from the A/D converters 301a-b (412). Next, the digital data is converted to decimal values 413. Next, it is determined whether output voltage V1 is greater than 156 mV (or any other voltage level associated with the switch-over point of the diodes connected in series (e.g., D1, D2, and D3 of FIG. 2A)) (414). If the output voltage V1 is greater than 156 mV, then the current is calculated according to the following equation: $I = \{(V1-V1(zero\ input))/R1\} + \{(V2-V2(zero\ input))/R2\}$ (418). Otherwise, the current is calculated according to the following equation: $I = (V1-V1(zero\ input))/R1$ (416). Then, the process 410 ends 419.

Figure 5:
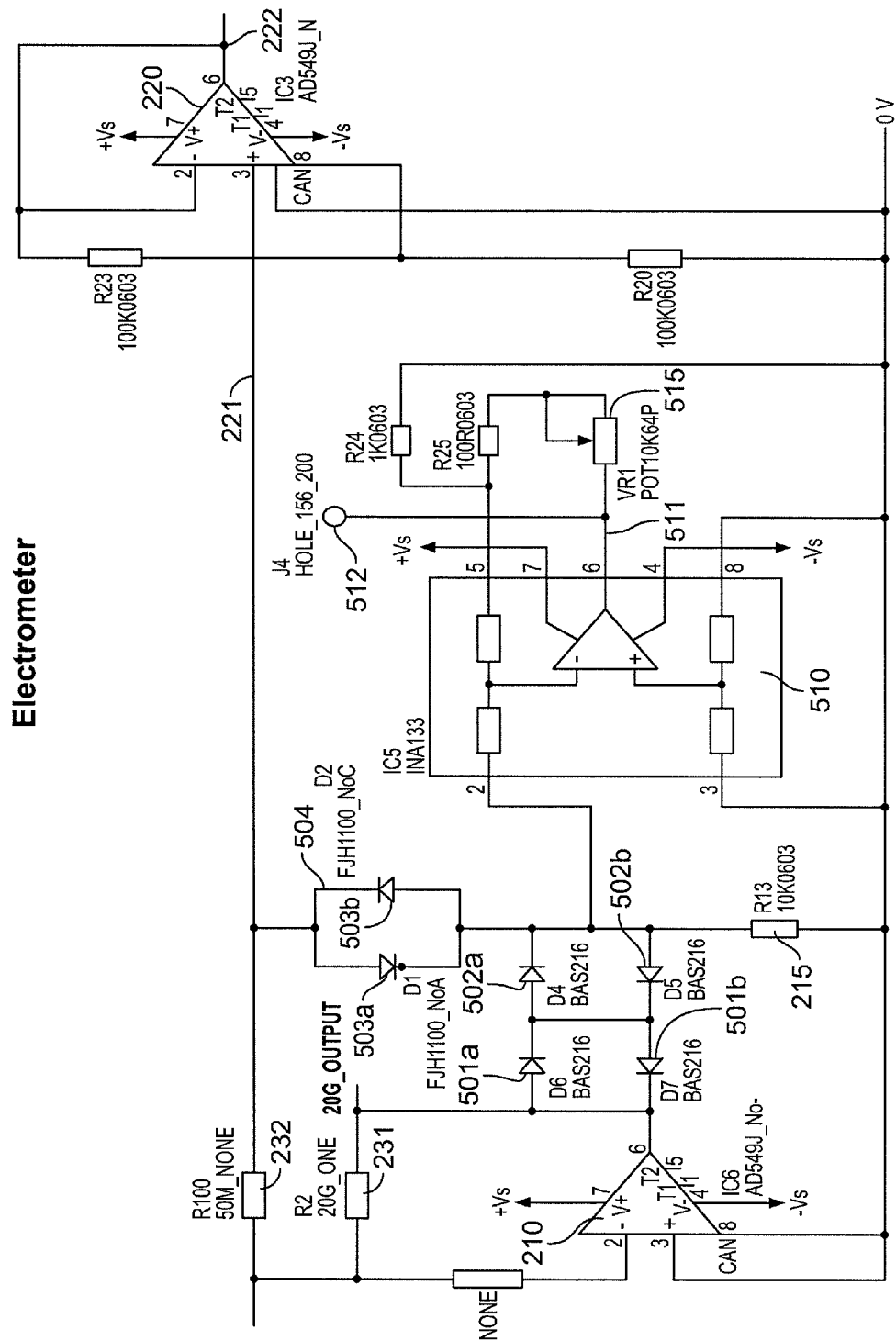
FIG. 5 is a schematic diagram of an electrometer according to another illustrative embodiment of the invention.

FIG. 5 is a schematic diagram of an electrometer according to another illustrative embodiment of the invention. The electrometer according to this embodiment is configured to work with either polarity of a signal by using two pairs of diodes wired back-to-back in a reverse parallel configuration. Specifically, the pair of diodes 501a-b are connected in parallel and arranged with reverse polarity. Similarly, the pair of diodes 502a-b are connected in parallel and arranged with reverse polarity. Finally, the pair of diodes 503a-b are connected in parallel and arranged with reverse polarity. The pairs of diodes 501a-b, 502a-b, and 503a-b are then connected in series between amplifier 210 and the second end 221 of the second resistive element 232.

The embodiment of the electrometer shown in FIG. 5 includes a variable gain inverting amplifier 510. The output 511 of the variable gain inverting amplifier 510 is connected to the mounting hole 512 for the PTFE standoff. The mounting hole 512 is used to support the wiring 212 connected to the cathode 504 of diode 503b so that approximately 0.18 pF of capacitance appears between the output 511 of the variable gain inverting amplifier 510 and the cathode 504 of diode 503b. In other embodiments, other types of capacitive components are connected between the output 511 of the variable gain inverting amplifier 510 and the cathode 504 of diode 503b to provide a charge equal and opposite to the charge on the diodes 503a-b. The electrometer of FIG. 5 also includes a potentiometer 515 connected to the output 511 of the variable gain inverting amplifier 510. The potentiometer 515 allows a small adjustment in the gain of the amplifier 510 to compensate for different capacitances between individual diodes 503a-b because of manufacturing variances.

Figure 6:
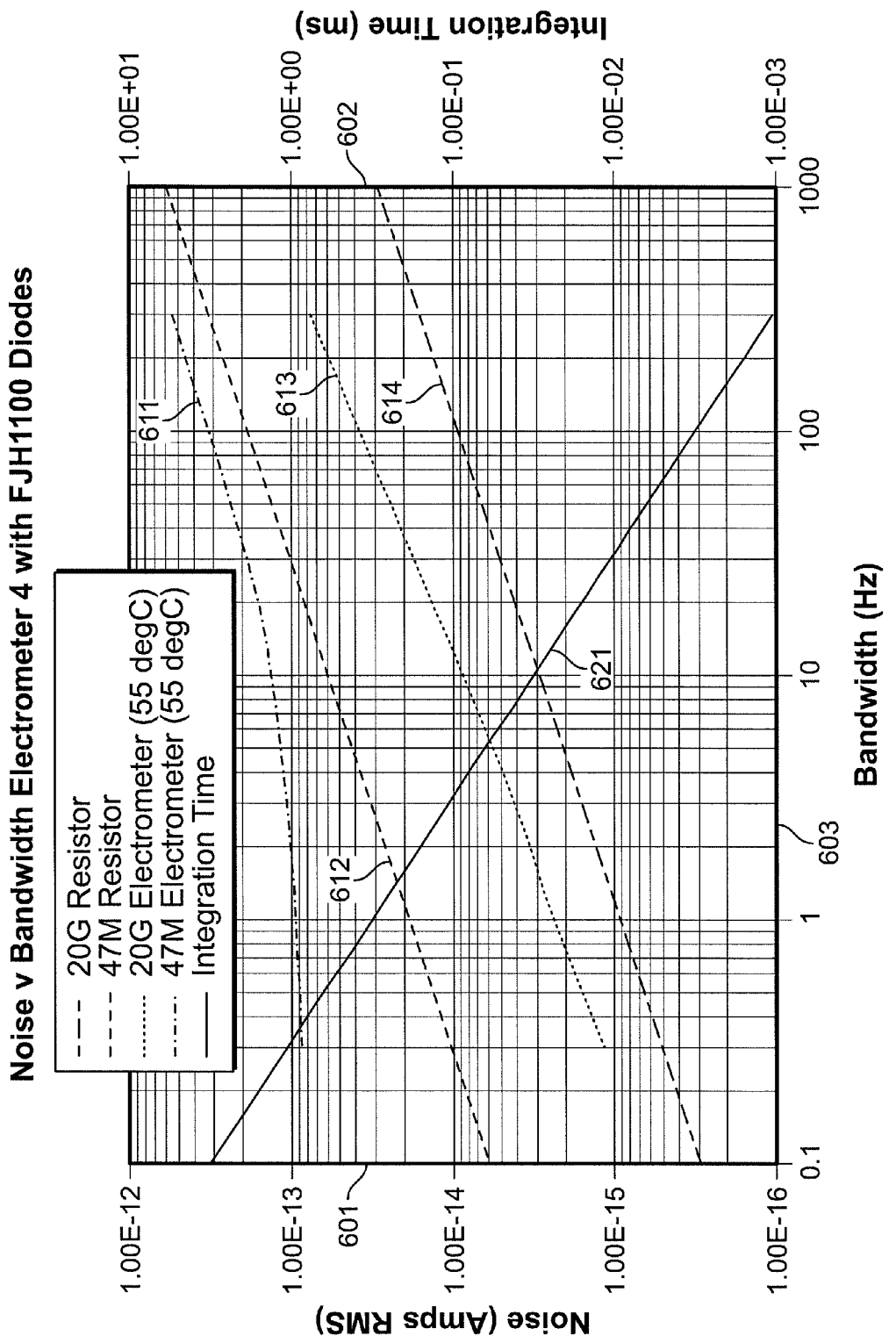
FIG. 6 is a graph illustrating the performance of the electrometer of FIG. 5 in terms of noise.

The performance of embodiments of the invention can be described in terms of the noise and the response. FIG. 6 is a graph illustrating the noise performance of the electrometer of FIG. 5. The noise was measured by taking the standard deviation (equivalent to the RMS value) from a number of readings at different integration times with zero signal applied. The left vertical axis 601 in the graph of FIG. 6 indicates the noise in Amps, the horizontal axis 603 indicates the bandwidth in Hertz, and the right vertical axis 602 indicates the integration time in milliseconds. Line 614 represents the theoretical noise attributable to resistor R1 with a resistance of 20 gigaohms and line 613 represents the actual noise attributable to the same resistor at 55 degrees Celsius. The actual noise performance is worse than the theoretical performance partly because of the external noise pick-up, but mainly because of the higher than normal amplifier input bias currents, which are due to operating at the elevated temperature of 50 degrees Celsius. If the electrometer were operated at a more normal temperature of 25 degrees Celsius, the noise performance would be very close to the theoretical value.

Similarly, line 612 represents the theoretical noise attributable to resistor R2 with a resistance of 47 megaohms and line 611 represents the actual noise contribution to the same resistor with electrometer amplifiers when these components operate at 55 degrees Celsius. Thus, the graph of FIG. 6 shows that the noise attributable to resistors R1 and R2 increases as the bandwidth increases (or integration time decreases).

Figure 7A:
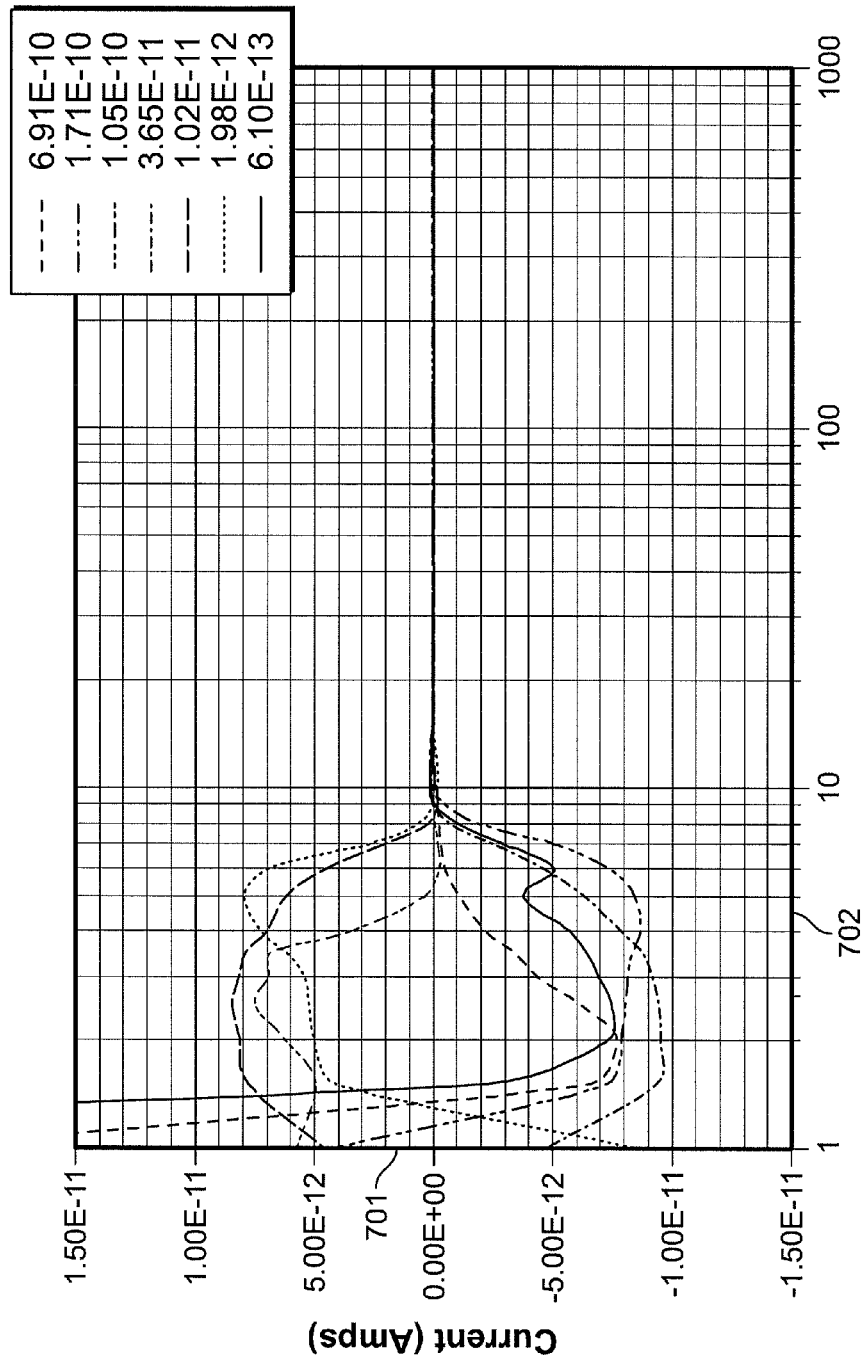
FIGS. 7A-7C are graphs illustrating the performance of the electrometer of FIG. 5 in terms of settling time.
Figure 7B:
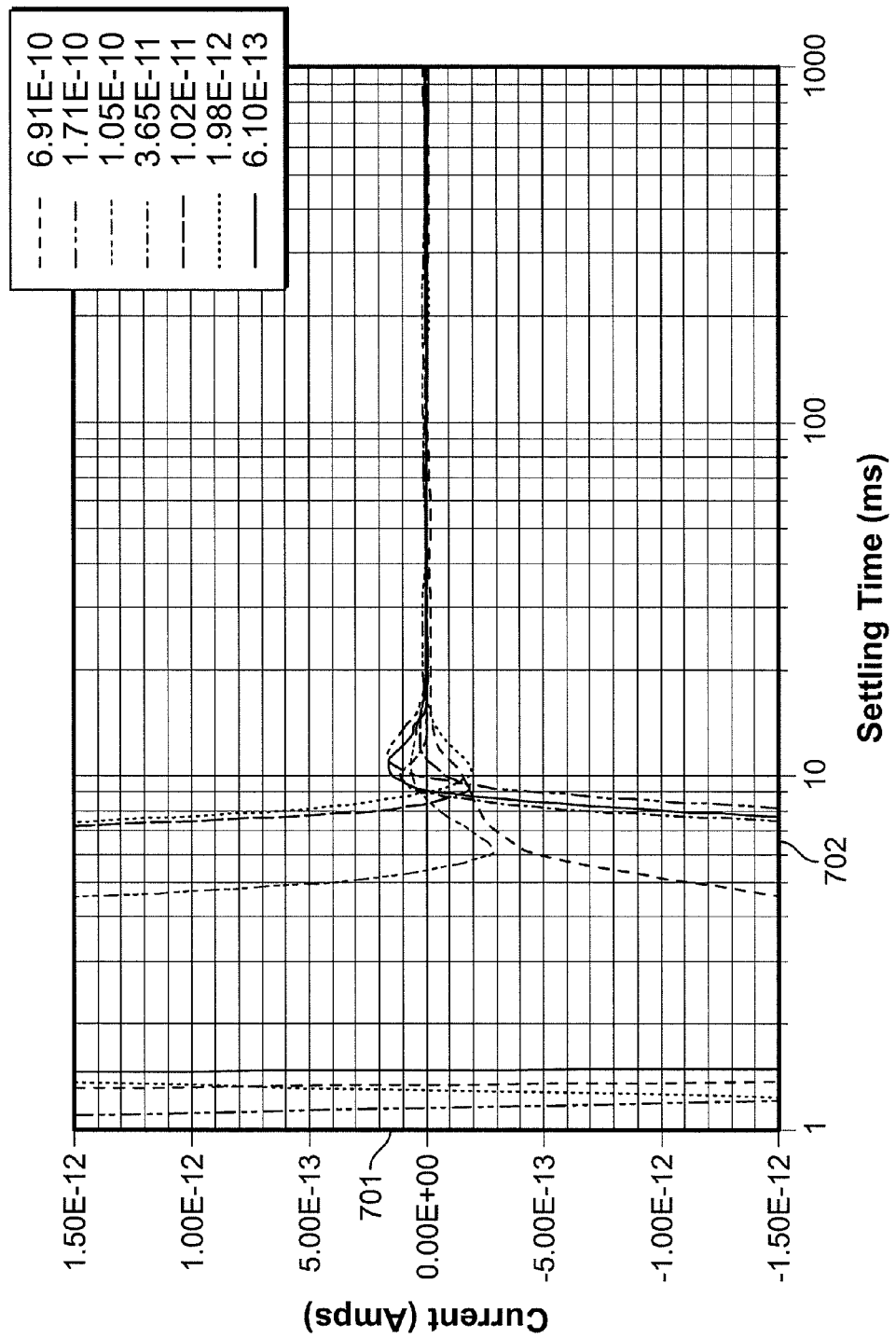
Figure 7C:
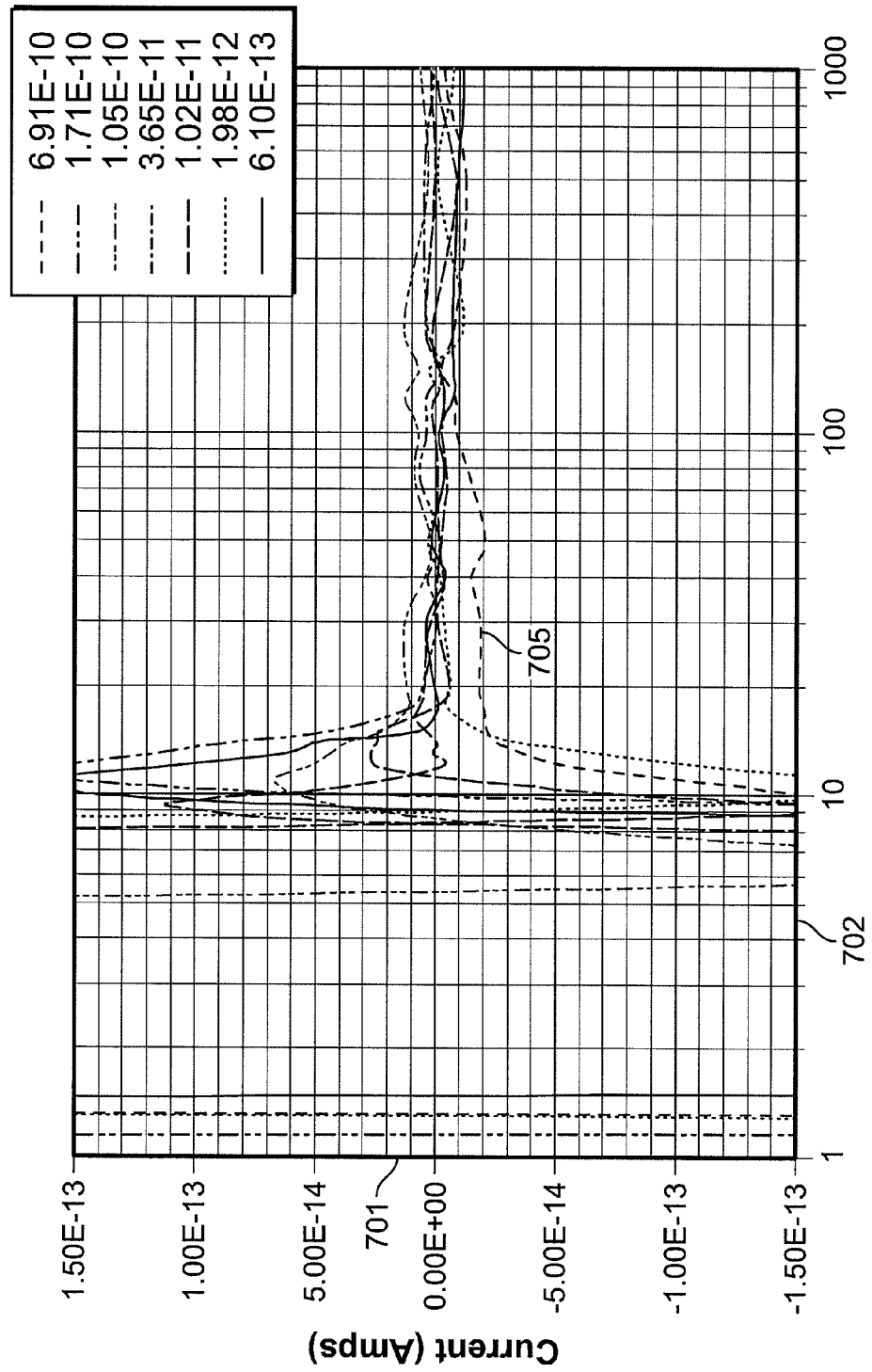

FIGS. 7A-7C illustrates the response of the electrometer of FIG. 5. One response performance parameter is the time required to settle to zero, or as close to it as is compatible with the noise level offered by the integration time used. This is particularly true for the case where the signal current has been large such that the low leakage diode(s) has been conducting and its charge will need to be removed so that the output can settle to zero quickly.

The graphs of FIGS. 7A-7C include a vertical axis 701, which indicates the measured current level in Amps, and a horizontal axis 702, which indicates the settling time in milliseconds. The graphs of FIGS. 7A-7C show the settling time with increasing magnification. The seven data lines represent input current signals ranging from 6.10E-13 Amps to 6.91E-10 Amps. In particular, the graphs show that a current signal of 6.91E-10 Amps (705 in FIG. 7C) settled to less than 2E-14 Amps in less than 20 ms. In other words, it settled to less than 29 ppm in less than 20 ms.

The above-described methods can be implemented in digital electronic circuitry, or in computer hardware, firmware, software, or in combinations of them. The implementation can be a computer program product, i.e., a computer program tangibly embodied in an information carrier, e.g., in a machine-readable storage device, for execution by, or to control the operation of, a data processing apparatus, e.g., a programmable processor, a computer, or multiple computers.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps can be performed by one or more programmable processors executing a computer program to perform functions of the invention by operating on input data and generating output. Method steps can also be performed by, and apparatus can be implemented as, special purpose logic circuitry, e.g., an FPGA (field programmable gate array) or an ASIC (application specific integrated circuit). Units can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Data transmission and instructions can also occur over a communications network.

Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The term "unit" as used herein, means, but is not limited to, a software or hardware component which performs certain tasks. A unit may advantageously be configured to reside on addressable storage medium and configured to execute on one or more processors. A unit may be fully or partially implemented with a general purpose integrated circuit (IC), FPGA, or ASIC. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

The invention claimed is:

1. An electrometer, comprising:
an amplifier having an inverting input, a non-inverting input, and an output;
first and second resistive elements each having a first end and a second end, the first ends of the first and second resistive elements electrically coupled to the inverting input of the amplifier and the second end of the first resistive element electrically coupled to the output of the amplifier;
a buffer having a high-impedance input and an output, the second end of the second resistive element electrically coupled to the input of the buffer; and
at least one diode electrically coupling the output of the amplifier to the second end of the second resistive element,
wherein the buffer is a second amplifier having an inverting input, a non-inverting input, and an output, the output of the second amplifier being electrically coupled to the inverting input of the second amplifier, the non-inverting input of the second amplifier being the input of the buffer and the output of the second amplifier being the output of the buffer.

2. The electrometer of claim 1 further comprising a computational unit electrically coupled to the outputs of the amplifier and the buffer, the computational unit being configured to compute a current level based on the resistance values of the first and second resistive elements and the voltage levels at the outputs of the amplifier and the buffer.

3. The electrometer of claim 1 wherein the resistance of the second resistive element is greater than the resistance of the first resistive element.

4. The electrometer of claim 3 wherein the first resistive element is between 10 megaohms and 100 megaohms and the second resistive element is between 5 gigaohms and 50 gigaohms.

5. The electrometer of claim 3 wherein the ratio between the resistances of the resistive elements is greater than 10.

6. An electrometer, comprising:
an amplifier having an inverting input, a non-inverting input, and an output;
first and second resistive elements each having a first end and a second end, the first ends of the first and second resistive elements electrically coupled to the inverting input of the amplifier and the second end of the first resistive element electrically coupled to the output of the amplifier;
a buffer having a high-impedance input and an output, the second end of the second resistive element electrically coupled to the input of the buffer;
at least one diode electrically coupling the output of the amplifier to the second end of the second resistive element, wherein the at least one diode comprises a first diode and a low-leakage and low-capacitance second diode having a first end and a second end, the first end of the second diode electrically coupled to the input of the buffer, the second end of the second diode electrically coupled to the first diode;
a capacitor; and
an adjustable gain amplifier having an input and an output, the input of the adjustable gain amplifier electrically coupled to the second end of the second diode, the output of the adjustable gain amplifier electrically coupled to the first end of the second diode through the capacitor, the adjustable gain amplifier being configured to discharge the capacitor with a charge opposite the charge in the second diode.

7. An electrometer, comprising:
an amplifier having an inverting input, a non-inverting input, and an output;
first and second resistive elements each having a first end and a second end, the first ends of the first and second resistive elements electrically coupled to the inverting input of the amplifier and the second end of the first resistive element electrically coupled to the output of the amplifier;
a buffer having a high-impedance input and an output, the second end of the second resistive element electrically coupled to the input of the buffer;
at least one diode electrically coupling the output of the amplifier to the second end of the second resistive element;
a first anti-alias filter and a second anti-alias filter, the first anti-alias filter electrically coupled to the output of the amplifier, the second anti-alias filter electrically coupled to the output of the buffer; and
a first analog-to-digital (A/D) converter and a second A/D converter, the first A/D converter electrically coupled to the output of the first anti-alias filter, the second A/D converter electrically coupled to the output of the second anti-alias filter, the first A/D converter and the second A/D converter.

8. A method for measuring current, comprising:
sensing a first voltage at an output of an amplifier;
computing a current based on the first voltage and a resistance of a first resistive element electrically coupled between an inverting input of the amplifier and the output of the amplifier if the first voltage is below a predetermined level;
sensing a second voltage at the output of a buffer;
computing a current based on the first and second voltages and the resistances of the first resistive element and a second resistive element, the second resistive element being electrically coupled between the inverting input of the amplifier and an input of the buffer, if the voltage output from the amplifier is above the predetermined level;
sampling a change in forward voltage of at least one of a plurality of diodes electrically coupled between the input of the buffer and the output of the amplifier; and
injecting a first charge into the at least one of the plurality of diodes, the first charge being opposite to a second charge associated with the at least one of the plurality of diodes.

9. The method of claim 8 further comprising adjusting the level of the first charge to match the second charge associated with the at least one of the plurality of diodes.

10. A method for measuring current, comprising:
sensing a first voltage at an output of an amplifier;
computing a current based on the first voltage and a resistance of a first resistive element electrically coupled between an inverting input of the amplifier and the output of the amplifier if the first voltage is below a predetermined level;
sensing a second voltage at the output of a buffer; and
computing a current based on the first and second voltages and the resistances of the first resistive element and a second resistive element, the second resistive element being electrically coupled between the inverting input of the amplifier and an input of the buffer, if the voltage output from the amplifier is above the predetermined level, wherein sensing the voltages comprises reading first voltage data output from a first A/D converter electrically coupled to the output of the amplifier and reading second voltage data output from a second A/D converter electrically coupled to the output of the buffer.

11. The method of claim 10 further comprising:

applying a zero-input signal to the inverting input of the amplifier; and reading first voltage data from the first A/D converter to obtain zero-input voltage data, wherein computing a current based on the resistance of the first resistive element comprises computing a difference between the first voltage data and the zero-input voltage data and dividing the result by the resistance of the first resistive element to obtain first current data.

12. The method of claim 11 further comprising:

reading second voltage data from the second A/D converter to obtain second zero-input voltage data, wherein computing a current based on the resistances of the first resistive element and the second resistive element comprises computing a difference between the second voltage data and the second zero-input voltage data and dividing the result by the resistance of the second resistive element to obtain second current data, and summing the first current data and the second current data.

* * * * *

UNITED STATES PATENT AND TRADEMARK OFFICE
CERTIFICATE OF CORRECTION

| | | |
|---|---|---|
| PATENT NO. | : 8,278,909 B2 | Page 1 of 1 |
| APPLICATION NO. | : 12/504652 | |
| DATED | : October 2, 2012 | |
| INVENTOR(S) | : William Roger Fletcher | |

It is certified that error appears in the above-identified patent and that said Letters Patent is hereby corrected as shown below:

In the Specifications

At column 3, line 38, amend "of the second resistive element" to --of the first resistive element--.

In the Claims

In Claim 3, at column 13, line 34, amend "second resistive element is greater than" to --second resistive element is less than--.

In Claim 4, at column 13, line 36, amend "wherein the first resistive" to --wherein the second resistive--.

In Claim 4, at column 13, line 38, amend "second resistive element" to --first resistive element--.

Signed and Sealed this
Eighth Day of April, 2014

Michelle K. Lee
*Deputy Director of the United States Patent and Trademark Office*